United States Patent [19]
Deacon

[11] Patent Number: 5,206,868
[45] Date of Patent: Apr. 27, 1993

[54] RESONANT NONLINEAR LASER BEAM CONVERTER

[75] Inventor: David A. G. Deacon, Los Altos, Calif.
[73] Assignee: Deacon Research, Palo Alto, Calif.
[21] Appl. No.: 826,316
[22] Filed: Jan. 24, 1992

Related U.S. Application Data

[63] Continuation-in-part of Ser. No. 632,447, Dec. 20, 1990, Pat. No. 5,134,622.

[51] Int. Cl.$^5$ .............................................. H01S 3/10
[52] U.S. Cl. ........................................ 372/21; 372/22; 372/31; 372/32; 372/94; 359/326; 359/328; 359/330
[58] Field of Search ................... 372/21, 22, 18, 20, 372/94, 31, 32; 359/326, 328, 330

[56] References Cited

U.S. PATENT DOCUMENTS

| | | | |
|---|---|---|---|
| 4,194,168 | 3/1980 | Jarrett et al. | 372/94 |
| 5,025,446 | 6/1991 | Kuizenga | 372/21 |
| 5,068,546 | 11/1991 | Hemmerich et al. | 359/328 |
| 5,121,402 | 6/1992 | Scheps | 372/22 |
| 5,144,630 | 9/1992 | Lin | 372/22 |

OTHER PUBLICATIONS

A. Hemmerich et al., *Opt. Lett.*, vol. 15, No. 7, pp. 372–374 Apr. 1, 1990.
W. J. Kozlovsky et al., *Appl. Phys. Lett.*, vol. 56, pp. 2291–2292 (1990)–Jun.
L. Goldberg et al., *Appl. Phys. Lett.*, vol. 55, pp. 218–220 (1989), Jul.
G. J. Dixon et al., *Opt. Lett.*, vol. 14, pp. 731–733 (Jul. 1989).
C. Zimmermann et al., *Opt. Commun.*, vol. 71, pp. 229–234 (1989)–May.
T. Baer, *J. Opt. Soc. Am.*, vol. B3, pp. 1175 (1986)–Sep.
W. P. Risk et al., *Appl. Phys. Lett.*, vol. 52, pp. 85–87 (1988)–Jan.
P. N. Kean et al., and S. G. Grubb et al. Technical Digest, Conference on Lasers and Electro-Optics, Optical Society of America, Washington DC, May 1991, papers CFJ5 and CFJ6.
L. Goldberg et al. *Appl. Phys. Lett.* vol. 56, pp. 2071–2073 (1990)–May.
W. J. Kozlovsky et al., *IEEE J. Quant. Elect.* vol. QE24, pp. 913–919 (1988)–Jun.
T. W. Hänsch et al., *Opt. Commun.*, vol. 35, pp. 441–444 (1980)–Dec.
Laurent et al., *IEEE Journ. Quant. Elect.*, vol. 25, pp. 1131–1142 (1989)–Jun.
R. W. P. Drever et al., *Appl. Phys. B.*, vol. 31, pp. 97–105 (1983).
E. J. Lim et al., *Elect. Lett.*, vol. 25, pp. 731–732 (1989)–May.
J. D. Bierlein et al., *Appl. Phys. Lett.*, vol. 56, pp. 1725–1727 (1990)–Apr.

*Primary Examiner*—Georgia Y. Epps
*Attorney, Agent, or Firm*—Townsend and Townsend Khourie and Crew

[57] ABSTRACT

Multiple step nonlinear conversion apparatus for optical frequencies which make use of resonant enhancement to increase net conversion efficiency. In one embodiment, two nonlinear converters are disposed in a single buildup cavity. In a second embodiment, two buildup cavities are provided, with one nonlinear element in each. In the single cavity configuration of the invention, the pump laser output is resonated in a buildup cavity and a first nonlinear element is used to generate the second harmonic. The second harmonic is resonated to enhance the doubling efficiency. A second nonlinear element mixes the pump beam and the second harmonic to produce an output beam at a linear combination of the two resonated frequencies. The conversion efficiency of the mixing is enhanced by the buildup factors at both the pump frequency and the second harmonic frequency. The buildup factors produced by the resonator enhance both the doubling and the mixing steps simultaneously. This is a versatile nonlinear conversion approach which applies both to frequency tripling and frequency quadrupling. In a special case, the third harmonic of the pump frequency is produced if the phase matching condition is adjusted to mix the laser frequency and the second harmonic. In a further special case, the fourth harmonic is generated when the phase matching is adjusted to mix the second harmonic beam with itself.

44 Claims, 10 Drawing Sheets

RESONANT NONLINEAR LASER BEAM CONVERTER

CROSS-REFERENCE TO RELATED APPLICATION

The present application is a continuation-in-part application of co-pending patent application Ser. No. 07/632,447 filed Dec. 20, 1990, now U.S. Pat. No. 5,134,622 issued Jul. 28, 1992 for DIODE PUMPED OPTICAL PARAMETRIC OSCILLATOR. The content of the parent patent application is incorporated herein by reference.

BACKGROUND OF THE INVENTION

The present invention relates generally to nonlinear frequency conversion of coherent optical radiation and more particularly to resonant mixing of laser radiation.

Techniques of nonlinear conversion are well known in the art. A major practical drawback of the general nonlinear approach to generating short wavelength coherent radiation is that the conversion efficiency is proportional to the laser power. To obtain useful conversion efficiencies, pulsed lasers are typically used to pump the nonlinear element because of the high peak power these devices produce. Any method which reduces the pump power required to obtain a useful nonlinear conversion would greatly expand the types of lasers which can be used, and therefore would increase the number of available wavelengths.

One alternative method is the buildup cavity or resonant cavity approach, in which the frequency conversion element is surrounded with a buildup cavity wherein the laser power can build up to a value larger than the pump beam power by a factor of many hundred. The net conversion efficiency is improved by the square of this buildup factor.

Specific examples are the frequency doubler in a singly resonant buildup cavity, which have been described in A. Hemmerich et al. [Opt. Lett. Vol. 15, pp. 372-374 (1989), U.S. patent application Ser. No. 07/573,536]; W. J. Kozlovsky et al. [Appl. Phys. Lett. Vol. 56, pp. 2291-2292 (1990)]; L. Goldberg et al. [Appl. Phys. Lett., Vol. 55, pp. 218-220 (1989)]; and G. J. Dixon et al. [Opt. Lett., Vol. 14, pp. 731-733 (1989)].

A dual frequency buildup cavity has been used in frequency doubling by Zimmermann et al. [Opt. Commun. Vol. 71, pp. 229-234 (1989)]. In this experiment, both the pump radiation and the frequency doubled output were resonated to further enhance the doubling efficiency.

Use has been made of the resonant cavity of a laser for intracavity nonlinear conversion, as described for instance by Baer [J. Opt. Soc. Am. Vol. B3, pp. 1175 (1986)] for doubling the laser output, and by Risk et al. [Appl. Phys. Lett. Vol. 52, pp. 85-87 (1988)] for mixing the laser beam with its optical pump beam.

The dual buildup cavity has recently been demonstrated in the laser cavity context by Kean et al., and Grubb et al. [Technical Digest, Conference on Lasers and Electro-Optics, Optical Society of America, Wash. D.C., May 1991, papers CFJ5 and CFJ6]. In these approaches, the laser operates at one of the resonant frequencies, and either the laser pump frequency [Kean, op. cit.] or the doubled output frequency [Grubb, op. cit.] is resonated.

Two lasers have been mixed in a singly resonant buildup cavity by Goldberg et al. [Appl. Phys. Lett. Vol. 56, pp. 2071-2073 (1990)], to produce the desired sum frequency.

It is often desirable to multiply the frequency of a laser by a factor of more than two, e.g., by tripling, or quadrupling. These steps require additional nonlinear conversions. In the prior art, no consideration has been given to the use of a second nonlinear element within the buildup cavity, or to the chaining of successive buildup cavities. What is needed is a buildup cavity configuration which allows multiple frequency conversion steps and which is compatible with the many alternative nonlinear conversion techniques such as doubling, mixing, parametric oscillation, and their combinations.

SUMMARY OF THE INVENTION

According to the invention there is provided multiple nonlinear conversion for optical frequencies which makes use of resonant enhancement to increase net conversion efficiency. In one embodiment of an apparatus according to the invention, two nonlinear converters are disposed in a single buildup cavity. In a second embodiment, two buildup cavities are provided, with one nonlinear element in each. In the single cavity configuration of the invention, the pump laser output is resonated in a buildup cavity and a first nonlinear element is used to generate the second harmonic. The second harmonic is resonated to enhance the doubling efficiency. A second nonlinear element mixes the pump beam and the second harmonic to produce an output beam at a linear combination of the two resonated frequencies. The conversion efficiency of the mixing is enhanced by the buildup factors at both the pump frequency and the second harmonic frequency. The buildup factors produced by the resonator enhance both the doubling and the mixing steps simultaneously. This is a versatile nonlinear conversion approach which applies both to frequency tripling and frequency quadrupling. In a special case, the third harmonic of the pump frequency is produced if the phase matching condition is adjusted to mix the laser frequency and the second harmonic. In a further special case, the fourth harmonic is generated when the phase matching is adjusted to mix the second harmonic beam with itself.

By combining the two nonlinear conversion steps in the same cavity, the intensity buildup apparatus is used three or four times, depending on the desired output frequency, rather than one or two times, as in the prior art. In a tripler, the buildup factors for both the laser frequency and the second harmonic contribute twice in the enhancement of the tripled output efficiency. In a quadrupler, the buildup factor for the second harmonic contributes a second time in the enhancement of the quadrupled output efficiency.

If the second nonlinear element has significant loss at either the pump frequency or the harmonic frequency, it will degrade the buildup factor at that frequency. If the loss is high enough, the degradation outweighs the advantages of the simultaneous enhancement of the two nonlinear processes. Therefore it is preferable to place two lossy nonlinear elements in two separate cavities optically coupled together so that the output of the first resonator feeds the input of the second resonator in a further embodiment of the invention. The first resonator cavity doubles the input beam and the second cavity mixes the output or outputs of the first.

One of the advantages of the invention is that devices according to the invention can be configured in many alternative forms, depending on the optimization technique chosen. The invention can be adapted in several ways to the varying availability of low-loss optical components in different regions of the electromagnetic spectrum. Alternative embodiments may be distinguished from each other by differences in structural configuration or by differences in the types of elements as in the case where a mirror has alternative coatings for reflection at only one wavelength or at multiple selected wavelengths.

In the special case of quadrupling, the second cavity need only be resonant at the second harmonic, and the second nonlinear element mixes the second harmonic beam with itself. In the special case of tripling, the second cavity is fed by both beams from the first cavity, and the two frequencies are mixed to produce the third harmonic.

The two-cavity alternative is often preferable when one of the optical elements (typically a nonlinear element) has high loss at one of the frequencies of cavity resonance. For example, in a tripler where the doubler element has 15% loss at the second harmonic, it is preferable to use a first buildup cavity which is resonant only at the laser frequency followed by a dually resonant mixer cavity. Second harmonic resonance is not useful in the first cavity because of the high loss of the doubler, but second harmonic resonance can still be exploited in the second cavity in this configuration.

In the case of quadrupling, it is desired to perform two dually resonant doubling steps. This could in principle be realized with a device in which the resonator mirrors are highly reflecting at all three of the optical frequencies: the laser, the second harmonic, and the fourth harmonic. Such a device would need three feedback systems to keep all three waves in resonance. While this is possible by feeding back on the cavity length and the tilt of both nonlinear elements, for example, it is not very practical to realize high reflecting mirrors at three frequencies simultaneously. It is preferable to use two consecutive buildup cavities where the first one is resonant at both the laser and the second harmonic, and the second is resonant at both the second and the fourth harmonic. The input to the first cavity is the laser frequency, the output of the first and the input to the second is the second harmonic, and the output of the second cavity is the fourth harmonic.

Two variations of the mixing buildup cavity are significant in their own right. The first is the dually resonant monolithic mixer in which two beams are adjusted to simultaneous resonance in a monolithic nonlinear element. The second is the guided wave resonant mixer in which a quasi phase matched nonlinear waveguide element is resonated to enhance its conversion efficiency.

The invention will be better understood by reference to the following detailed description taken in conjunction with the accompanying drawings.

DESCRIPTION OF THE PREFERRED EMBODIMENTS

Figure 1:
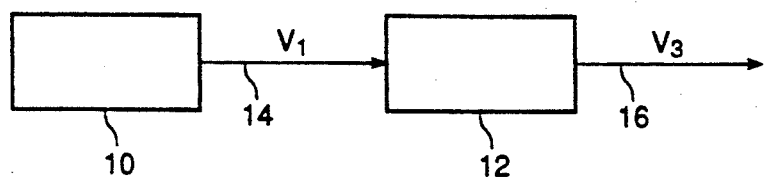
FIG. 1 is a schematic block diagram of a first embodiment of the invention.

FIG. 1 shows the elements of a first specific embodiment of a resonant nonlinear laser beam converter in accordance with the invention. A source laser system 10 produces a linearly polarized substantially monochromatic coherent beam 14 of a first optical frequency. At least a part of this emitted beam 14 enters the resonator system 12 in which the nonlinear conversion takes place. Two nonlinear elements 13, 15 located in the resonator generate a new frequency which may be used in the resonator 12 if the application has low loss, or it may be extracted from the resonator 12 to form output beam 16. Details of this basic structure are provided hereinafter.

Figure 2:
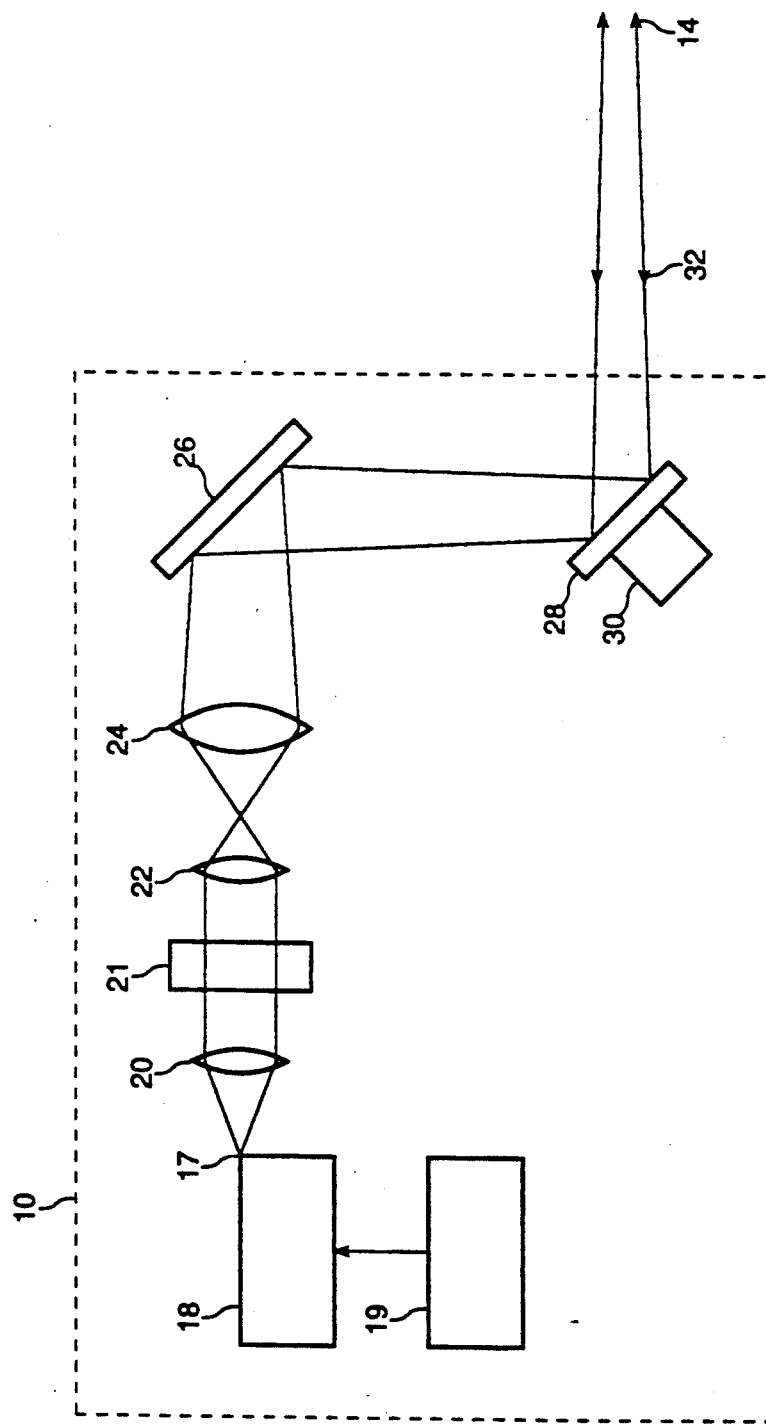
FIG. 2 is a schematic block diagram of a laser source system for producing an input beam to a resonator system.

FIG. 2 shows the pump laser system 10. The preferred laser source is a semiconductor diode laser 18, a small, efficient, rugged, and easily tunable source. In this invention the use of low power lasers such as the diode laser is now possible for the first time in this application. Of course, other kinds of lasers can also be used. The diode laser 18 is driven by a current source 19. The output of the laser 18 emitted through an emitting facet 17 is collimated by lens 20, passed through an optical isolator 21, and modematched to the transverse mode of the resonator by the lens pair 22 and 24. The purpose of the optical isolator 21 is to reduce the power of the return propagating beam 32 to a level which does not significantly disturb free running operation of the laser 18. A pair of mirrors 26 and 28 is disposed to allow adjustment of the axis of the beam 14 in both position and angle in order to align it with the axis of one segment of the resonator cavity. It is understood that a different number of lenses and mirrors may be used to accomplish the purposes of modematching and alignment. When it is desired to injection lock the laser 18, an optical return beam 32 is caused to retrace the path of the emitted beam 14, and the optical isolator 21 is removed. A piezoelectric transducer 30 is mounted on one of the mirrors to adjust the phase of the optical return beam relative to the emitted beam as an aid in injection locking the laser 18.

The emitting facet 17 of the diode laser is often antireflection (AR) coated. This enhances the laser power and changes the diode's optical feedback behavior. If the AR coating has a low enough reflectivity, the frequency of the emitted beam 14 can be stable even for high levels of optical feedback. Linear cavities, which typically provide high optical feedback when illuminated from an end mirror, can therefore be used with the diode laser only when it is properly AR coated, or when the isolator 21 is in place. Ring cavities (and linear cavities injected through an interior mirror) typically provide low levels of optical feedback. The ring cavities or interior injected linear cavities can then be coupled to the diode laser through the weak return beam 32 without an isolator or an AR coating.

Figure 3:
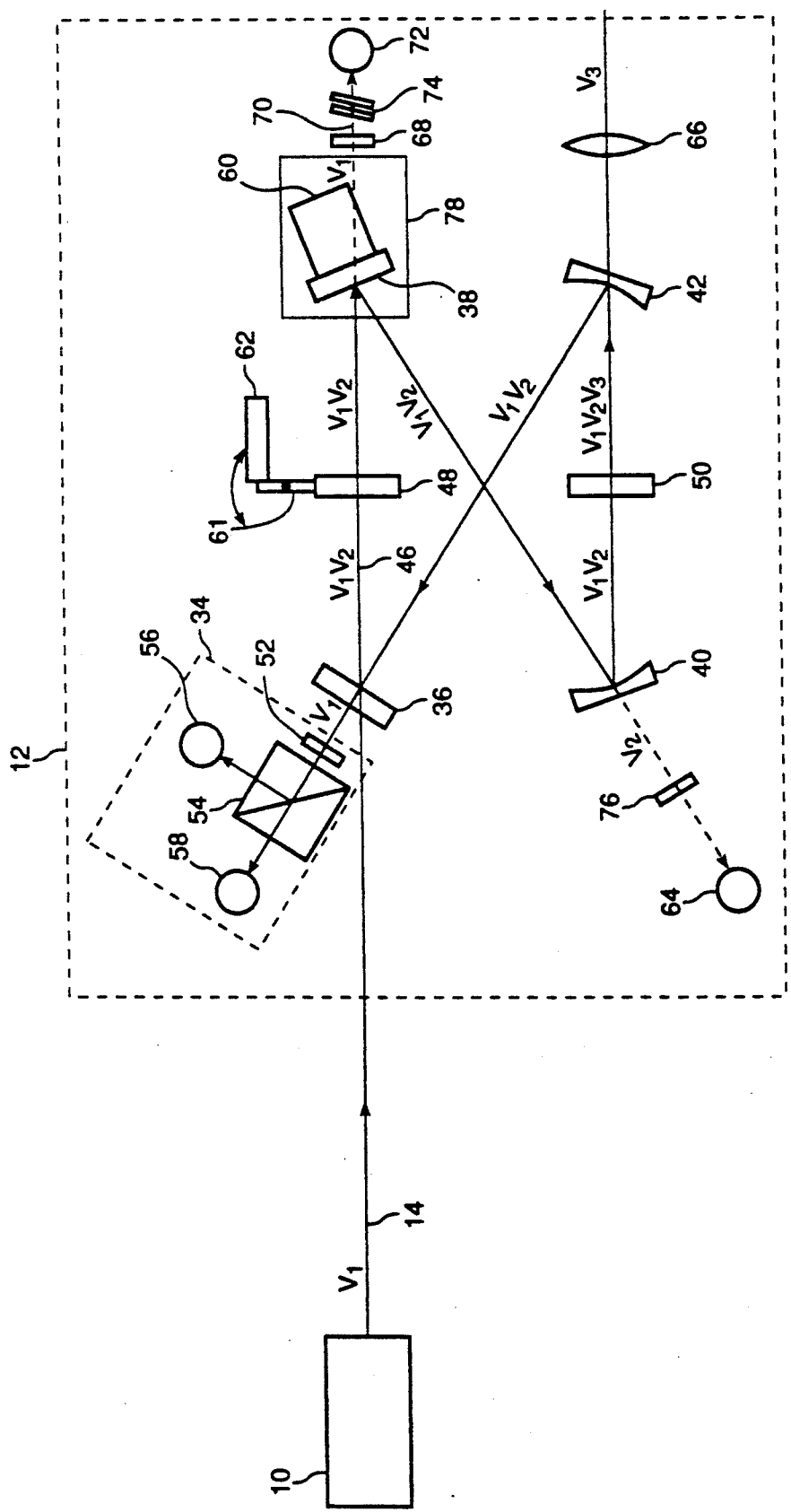
FIG. 3 is a schematic block diagram of a further embodiment of the invention including a doubly resonant ring resonator.

FIG. 3 illustrates a first specific embodiment of a resonant nonlinear laser beam converter 12 in accordance with the invention. A source laser system 10 is shown along with a converter 12 in the form of a planar ring resonator cavity system which includes a helicity detector 34 for use in feedback control. A portion of the incident laser beam 14 is transmitted through the resonator mirror 36 into the ring resonator formed by the mirrors 36, 38, 40, and 42. When the source laser system 10 has been properly adjusted, the beam matches the unidirectional lowest order transverse cavity mode 46 in waist size, location, beam position, and beam angle.

Mirrors 36, 38, 40, and 42 reflect both the laser frequency and a second frequency with minimal absorption, scatter, or diffraction loss. These mirrors are realized as multilayer dielectric coated optical elements. By superposing two (or more) quarter wave coating stacks, each optimized for reflection at a different wavelength, for example, one can fabricate a dually (or triply, etc.) reflecting mirror. The bandwidth of each of the high reflecting regions and their centering can be adjusted so that transmissions appear in various regions of the spectrum, and the transmissions can be enhanced with a few additional layers of selected thickness without unduly modifying the underlying reflection. There are limits on the number of layers which may be applied due to stress buildup and cost, but two or three reflectors can be made on the same substrate. The optical loss of a multicoated mirror is affected by the other coatings and their relative placement in the stack. It might be desirable, for example, to place a short wavelength coating on top of a long wavelength coating. In this case, the loss at the short wavelength is not affected by the longer wavelength stack, which might be lossy at the short wavelength. The loss at the longer wavelength is increased by the loss incurred in the short wavelength stack, but it is thinner than the long wavelength stack for the same number of layers, and may have lower losses. Of course, the performance of any of these mirrors depends on the fabrication technique. The preferred technique for multiple reflection mirrors appears to be ion beam deposition, since lower stresses and lower optical losses can be obtained.

In the preferred configuration, the second frequency is equal to twice the laser frequency. In principle, any harmonic may be used so that the generated frequency may be any multiple of the laser frequency. Alternatively, optical parametric generation may be used so that two frequencies are generated as described in the parent patent application. The reflective coatings on the input mirror 36 are selected to be transmissive of a small portion of the input beam 14. The transmission is set near the impedance matching condition (See Kozlovsky et al. [IEEE J. Quant. Elect. Vol. QE24, pp. 913–919 (1988)]) in order to reduce the reflected power in beam 44 when the system is operational. The transmission of the other mirrors 38, 40, and 42 is very low at the laser frequency. If the frequency of the laser beam 14 is adjusted to match one of the longitudinal modes of the resonator system 12, optical power will build up in the resonator mode 46 at the laser frequency. The polarization of the pump beam 14 is adjusted to "s" polarization in order to couple optimally with the lowest loss polarization mode of the resonator.

A first feedback loop is used to stabilize the power built up at the laser frequency and to maximize the first buildup factor, which is the ratio between the power propagating in cavity mode 46 at the laser frequency to the power incident on the resonator in beam 14. A detector 72 detects a portion of the beam 70 which is produced from cavity mode 46 via the residual transmission of the mirror 38. In operation, beam 70 passes through a hole in the transducer 60, then is partly transmitted through the mirror 68, then is filtered to the laser frequency by the optical filter 74, and then it illuminates the detector 72. The signal on detector 72 is therefore proportional to the power at the laser frequency. By modulating the source laser system 10 and/or the resonator system 12, a feedback control system can be established which maximizes the power built up at the laser frequency.

Two alternative approaches to implementing the feedback loop are locking the frequency of the beam 14 to the cavity mode and locking the frequency of the cavity mode to the beam 14. The helicity detector 34 may be used to establish an error signal proportional to the deviation of the pump laser frequency from the longitudinal mode frequency. The helicity detector 34 consists of a quarter wave plate 52, a polarizing beam splitter 54, and a pair of detectors 56 and 58. The difference between the signal provided by the two detectors is proportional to the helicity of the beam 44, and the difference can be used as an error signal. (See Hänsch et al. [Opt. Commun. vol. 35, pp. 441–444 (1980)].) The error signal can be amplified, integrated, and fed back to control the length of the resonator through a translator attached to one of the cavity mirrors, such as piezoelectric translator (PZT) element 60, so that the cavity mode frequency is locked to the laser frequency. In a variation, the laser frequency can be locked to the resonator by feeding back to a parameter which controls the frequency of beam 14. If the laser system 10 is injection locked by the counter-propagating beam 32 which originates from within the resonator, the PZT 30 of FIG. 2 can be adjusted to control the laser emission frequency. As an alternative, the laser frequency can be controlled when the output of the feedback circuit is coupled back to the diode laser current supply 19 with the appropriate gain and phase shift. In the latter case, the laser emission frequency is often stabilized by optically isolating the laser from the return beam 32.

The angle and temperature of the nonlinear element 48 are adjusted to produce phase matching between the input frequency and the second harmonic. This element may be $KNbO_3$ if the diode laser wavelength is near the advantageous 90 degree phase matching wavelengths of 860 nm or 986 nm; or it may be any material which phase matches the process and has low optical loss at the laser and harmonic frequencies, such as BBO (barium borate), which has an advantageous ultraviolet transmission characteristic. (The basic techniques of phase matching, including tilting the nonlinear element and adjusting the nonlinear element temperature are well known and have been described in the literature. The phase matching in element 48 can be purely of a type (called Type I) in which the second harmonic radiation is emitted with a polarization orthogonal to that of the beam at the laser frequency, in "p" polarization. The surfaces of the nonlinear element 48 are polished flat to minimize scatter loss and AR coated to minimize the Fresnel reflections.

The nonlinear element 48 is best placed at a location in the resonator where the transverse mode is focussed, which leads to optimal conversion efficiency. The second nonlinear element 50 should also be located at a focal position. In FIG. 3 it has been shown that the elements 48 and 50 are placed at the two foci of a four mirror resonator with a pair of curved mirrors. In an alternative configuration, the two elements could be placed side by side at a single focus.

It is advantageous to use a 90 degree phase matched material for the element 48 because, among other reasons, there is no walkoff. Walkoff or pointing vector walkoff is the phenomenon of double refraction in which two beams which enter a crystal in a collinear fashion separate from one another while passing through the crystal at a walkoff angle. In the case of no walfkoff, the second harmonic beam is produced along an axis collinear with that of the laser frequency beam. If a nonlinear material is used with walkoff, the two beams propagate in different directions in element 48 so that they no longer propagate coaxially in the resonator. The two beams cross on each other again with a certain crossing angle near the other foci of the resonator. To optimize the second harmonic power, the design of the resonator should be such that the two beams cross each other at their foci. A good way to do this is to make the cavity symmetric. A nonzero crossing angle at the location of the nonlinear element 50 reduces the overlap between the two beams there and thus reduces the conversion efficiency of the second nonlinear process. The phase matching in element 50 must also be compensated for any crossing angle.

If there is walkoff in element 50, this will create an additional crossing angle in element 48 in exactly the same way. This reduces the overlap in element 48, and requires compensation in its phase matching. In the ring resonator, the presence of walkoff in one nonlinear element typically reduces the overlap factor in the other nonlinear element.

A technique to reduce the effects of walkoff is to fabricate each nonlinear element out of two parts, the second of which partially compensates the walkoff of the first. This is done by making the second element in each element pair out of the same material as the first, but oriented with a 180 degree rotation about the axis of propagation of the ordinary beam. The walkoff angle of the extraordinary beam in the second part is then opposite to what it is in the first part. If the lengths of the two parts are identical, the net walkoff is zero. For some nonlinear materials, this rotation reverses the sign of the nonlinear coefficient, thereby reversing the direction of the power flow between the two beams in the second element of the pair. If this is the case, a dispersive element, such an air gap, may be inserted between the two crystals so as to reverse their relative phase, thereby maintaining the direction of power flow in the second element of the pair. The two-part compensation technique leaves intact, of course, the degradation effect of the walkoff on the conversion efficiency within each two-part nonlinear element, but it relieves the problem of disturbing the overlap in subsequent nonlinear elements of the system.

The second harmonic power produced by a process involving the second order nonlinear polarizability of the material 48 is proportional to the square of the power at the laser frequency. For this reason, the conversion efficiency is proportional to the power in the cavity mode 46 at the pump laser frequency. It is desirable to use a high power pump laser so that the conversion efficiency is high enough to be useful in a given application. By building up the power of the pump laser in the resonator system 12, the conversion efficiency is increased, making more power available for the application, and making it feasible to use a lower power pump laser to drive the converter.

The second harmonic light, which is produced by element 48, is needed also to excite a mode of the resonator and to build up, which creates a second longitudinal mode matching problem. Since the resonator mode matches the laser frequency due to the action of the first feedback loop, an automatic match is possible at the second harmonic frequency. However, for such automatic matching to occur, two steps must be taken. The mirror coatings must be "phased" so that they reflect the laser and the second harmonic frequencies with the same phase. Although a vacuum is not required, air, which is weakly dispersive, must be evacuated from the cavity. If the only other element in the resonator is phase matched for doubling, the two modes will automatically be on resonance simultaneously.

However, when a second nonlinear element is inserted and phase matched for a different nonlinear process, "automatic" resonance generally will not be achieved, and an adjustment method must be provided. If the cavity is not evacuated, the air dispersion allows a convenient adjustment. The air path length enclosed by the resonator mirrors can always be adjusted so that the second harmonic frequency also overlaps a longitudinal mode of the resonator in "p" polarization. The adjustment can be performed on any of the resonator mirrors, such as for example on mirror 38 using a coarse adjustment translator 78. Making this adjustment affects many of the resonator adjustments, but alignment can be restored by appropriate tilt adjustments to mirrors 38 and 40. Residual mismatches created by temperature drifts or atmospheric pressure variations may be corrected with a second feedback loop. Rotating the nonlinear element 48 about an axis parallel to the "s" polarization vector of the laser beam adjusts the index of refraction of the second harmonic without changing the index for the laser frequency. (See Zimmermann et al., previously cited). Small adjustments to this rotation angle can be controlled by a PZT 62 attached to flexure mount 61 through an electronic feedback loop without significant degradation of the phase matching. The angle can be dithered by the PZT 62. If a detector 64 is placed behind one of the cavity mirrors, such as mirror 40, to detect the residual transmission of the mirror, a lock-in amplifier with reference channel at the frequency of the PZT dithering can be used to derive the error signal. Since the phase matching depends much more weakly on the nonlinear element tilt than does resonance, the dither does not substantially affect the conversion efficiency. A filter 76 which is narrowly transmissive about the frequency of the second harmonic is used to eliminate the other optical frequencies at the detector 64. An alternative location for the feedback tilt adjustment is on the nonlinear element 50 where a similar approach can be applied.

Mirrors 36, 38, 40, and 42 have very low transmission at the second harmonic frequency to allow a large second buildup factor. The second buildup factor is defined as the ratio between the power propagating in the cavity mode 46 at the second harmonic frequency divided by the power generated in the nonlinear element 48 when the output mirror 38 has 100% transmission at the second harmonic. The angle and temperature of the second nonlinear element 50 are adjusted to produce phase matching between these two waves to produce a third or output frequency which in one configuration is the third harmonic of the laser frequency. Nonlinear element 50 may be a crystal of BBO oriented for Type II phase matching between the two orthogonally polarized beams in the resonator. (In Type II phase matching, two input beams are orthogonally polarized.) In an important alternative, element 50 is set up for Type I phase matching, but with its input plane rotated by 45 degrees from the polarizations of both input beams. In this case, the element 50 only uses half the power in each beam, since the projection of the polarization vector on the input plane is reduced by about a factor of 0.7. In general, element 50 may be any material which phase matches any portion of the two waves and has low optical loss at the laser and second harmonic frequencies. The surfaces of the optical element 50 are also polished flat and anti-reflection coated so as to minimize optical losses.

The generated third harmonic beam can be used intracavity if the optical losses of the application apparatus are small enough at both the laser frequency and the second harmonic so as not to reduce the buildup factors significantly. For most applications, however, it will be most convenient to have an outcoupled beam. To achieve this, the reflective coatings of the output mirror 42 are selected to have maximum transmission at the frequency of the third harmonic. The output beam 16 emerges through mirror 42 and may be collimated by lens 66.

When adjustments are made in the phase matching angle of element 50, the mode frequencies established during the doubly resonant doubling process are disturbed. If element 50 is a Type I doubler, producing the fourth harmonic for example, the phase matching adjustment is primarily a rotation about an axis parallel to the electric vector of the second harmonic beam. This adjustment leaves the second harmonic path length untouched, but it changes the effective index of refraction in the crystal for the laser frequency mode. The feedback loops established to maintain resonance have limited ranges, and they can easily be pushed beyond their ranges by adjusting the nonlinear element 50. For this reason, it is best to start with element 50 pre-aligned before the resonator cavity length is set to establish simultaneous resonance at both laser frequency and second harmonic. Fine adjustments to the element 50 can be made provided so that the other resonator adjustments can be periodically reoptimized.

A fraction of the light propagating in the forward direction in the resonator system 12 is coupled into the reverse direction. This may occur by either scattering off the surfaces of the nonlinear elements 48 and/or 50, or by reflection from an optical element such as the mirror 68 which is adjusted to partly retroreflect the weakly transmitted beam 70 emerging from the cavity. A fraction of this low power reverse beam forms the beam 32 which is coupled directly back into the pump laser 18 for injection locking. Since the beam 32 is formed from light which builds up on a longitudinal mode of the ring resonator, the laser 18 is automatically injection locked at one of the frequencies of the resonator. The piezoelectric transducer 30 is used to adjust the phase of the return beam to hold the injection locked frequency within the locking range of the coupled cavities. (See for example by Laurent et al. [*IEEE Journ. Quant. Elect.* Vol 25 pp. 1131–1142 (1989)]).

In an important alternative configuration, the output frequency is the fourth harmonic such that the device functions as a quadrupler. In this case, the second nonlinear element 50 doubles the second harmonic. The material for element 50 is selected to have a high nonlinear coefficient and to permit phase matching for doubling the second harmonic. The other constraints, such as low loss, good surface polish, and AR coatings, remain the same. A good material choice is again BBO, which has a good UV transmission, and can be Type I phase matched for doubling beams with vacuum wavelengths out to 409 nm. To achieve the quadrupler variation, all of the above described steps are taken, except that the phase matching of element 50 is modified. Optimal conversion is obtained with Type I phase matching for BBO, where the input plane is in the plane of polarization of the second harmonic beam, i.e., "p" polarized. The fourth harmonic beam will emerge as an "s" polarized beam.

Many types of nonlinear conversion can be performed in the nonlinear element 50 if the cavity and the material are sufficiently efficient. It is the efficiency of the present invention that makes possible the desired conversions. Since both the laser frequency beam and the second harmonic beam produced by element 48 are built up to high intensity by the dually resonant buildup cavity, either or both of these beams can be used as input beams for the nonlinear conversion in element 50. In general, element 50 can be phase matched for producing any linear combination of the laser frequency and second harmonic frequencies. Tripling is one times the laser frequency plus one times the second harmonic. Quadrupling is zero times the laser frequency plus two times the second harmonic.

Quintupling might be achieved by mixing one times the laser frequency plus two times the second harmonic, in a process using the third order nonlinear polarizability of a nonlinear material.

A further (third) buildup factor could be disposed in the resonator at the frequency of the output beam to further enhance the conversion efficiency. This is only practical if the added losses at the output frequency are low enough in the additional coatings and the other optical elements in the resonator. To make a third simultaneous resonance possible, a third adjustment is needed. Fortunately, three such adjustments are available, namely, the resonator length, the angle of element 48, and the angle of element 50. Another feedback loop could be fabricated to optimize the power propagating in the cavity at the output frequency by sensing the power in the output beam at that frequency.

Figure 4:
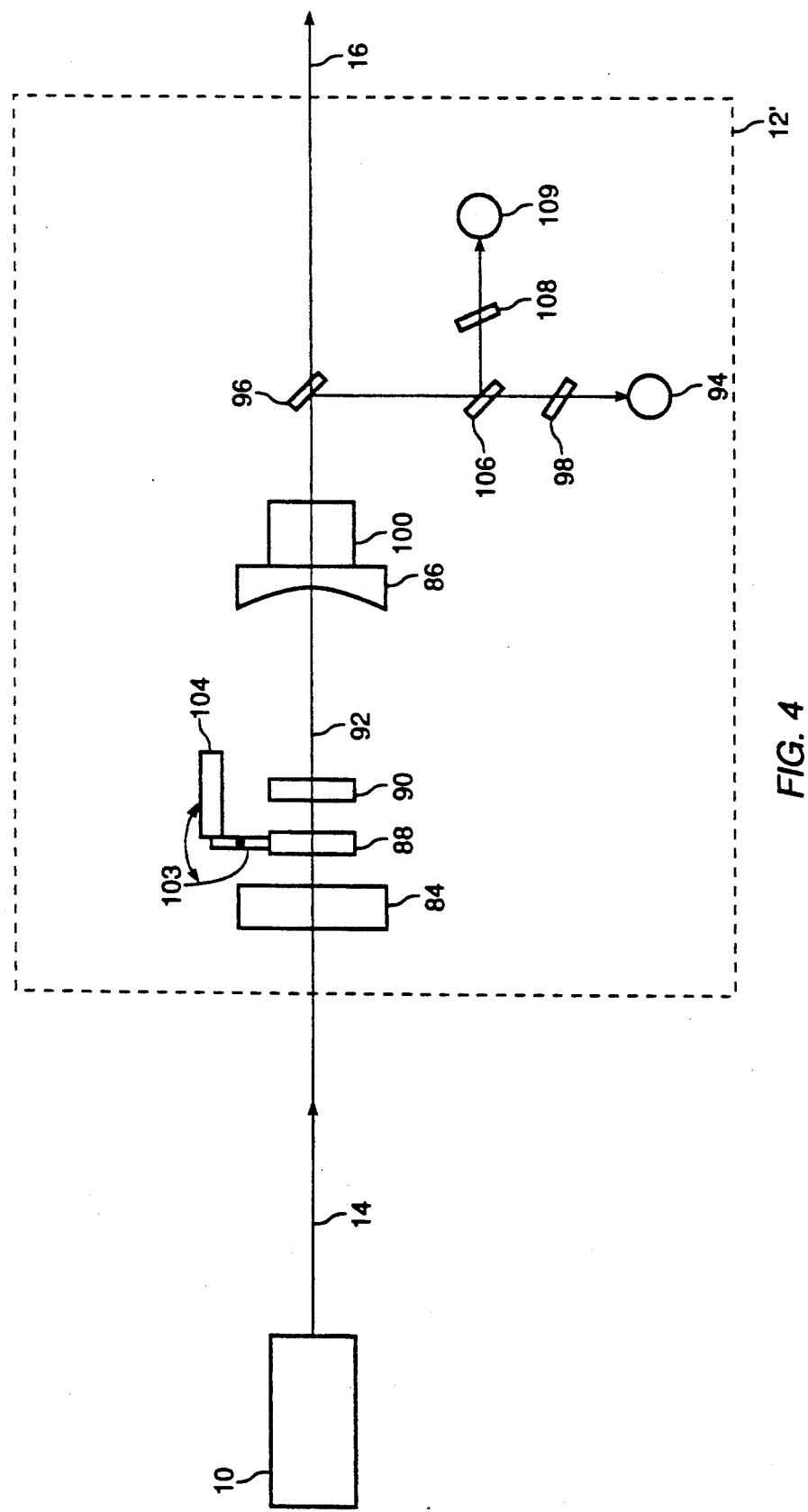
FIG. 4 is a schematic block diagram of a further embodiment of the invention including a doubly resonant linear resonator.

FIG. 4 shows an alternative embodiment of the invention which uses a linear bidirectional cavity resonator 12'. In the discussions of all of the alternative embodiments, an effort is made not to repeat common information. However, the applicable variations cited for a particular embodiment are understood also to pertain to the other embodiments. A laser system 10 produces a linear polarized monochromatic beam 14. The beam 14 enters the linear resonator 12' formed by the flat mirror 84 and the curved mirror 86 through the input mirror 84. Two nonlinear elements 88 and 90 are located in the resonator 12' near its focal point at the mirror 84. Mirror 84 has high reflectivity at the second harmonic and at a third or output frequency, and is transmissive at the laser frequency which impedance matches the beam 14 into the resonator. The output mirror 86 has high reflectivity at the laser frequency and the second harmonic, and high transmissivity at the third frequency, which is either the third or the fourth harmonic, depending on the phase matching of the nonlinear element 90. Both mirrors and both nonlinear elements are fabricated for minimum absorption, scatter, and diffraction losses. When the laser system 10 has been properly adjusted, the beam matches the lowest order cavity mode (designated 92) in waist size, location, beam position, and beam angle.

The frequency of the pump beam 14 is adjusted to match one of the longitudinal modes of the resonator 12', so that optical power builds up in the resonator mode 92 at the laser frequency. A first feedback loop is used to stabilize the power built up at the laser frequency. As before, two alternative approaches can be used to implement the feedback loop. A signal is derived from detector 94 which is proportional to the power propagating in the cavity at the laser frequency. A fraction of the power in the cavity mode 92 at the laser frequency leaks through the output mirror 86, passes through a hole in the PZT 100, is split off by mirror 96, passes through beamsplitter 106, and is spectrally filtered to the laser frequency by the filter 98. The mirror 96 is a dichroic mirror to allow the majority of the output frequency to pass into the output beam 16. The output mirror has low but nonzero transmission at the laser frequency. The laser frequency is locked to one of the cavity longitudinal mode frequencies by the well-known Pound-Drever technique. (See Drever et al. [Appl. Phys. B. Vol. 31, pp. 97–105 (1983)].) This technique involves modulating the laser frequency, deriving an error signal at the detector 94, and feeding back on the laser frequency.

Another locking technique is feedback control on the cavity length using the voltage on PZT 100 instead of the laser frequency, locking the cavity mode frequency to the laser frequency. In a further variation, the cavity length can be modulated with PZT 100 instead of the laser frequency.

The angle and temperature of the nonlinear element 88 are adjusted to produce phase matching between the input frequency and its second harmonic. The phase matching in element 88 can be purely Type I for several nonlinear materials in the visible region, in which case the second harmonic radiation builds up in the resonator with a polarization orthogonal to that of the laser frequency beam. In the phase matching case with walkoff, the two beams are collinear between the output mirror 86 and the nonlinear element 88, but not collinear elsewhere. As described below, any walkoff in the second nonlinear element will alter this situation.

The longitudinal position of the element 88 in the resonator is then adjusted to maximize the total conversion. This step is necessary because the conversion occurs in both directions in a linear cavity, and the phase of the two waves shifts from one pass through the element to the next. Because of the dispersion of air, adjusting the path length traveled by the two beams between the element 88 and the mirror 84 also adjusts the relative phase of the two beams. A few millimeters of adjustment are sufficient in the visible. (See Zimmermann et al.) When the cavity is resonant at the second harmonic, the other path (between the element 88 and the mirror 86) automatically satisfies the phasing condition.

The air path length enclosed by the resonator mirrors is adjusted by translator 102 to achieve simultaneous resonance for the laser frequency and the second harmonic frequency. A second feedback loop rotates the nonlinear element 88 about an axis parallel to the polarization vector of the laser frequency beam with PZT 104 which is attached to flexure mount 103. Detector 109 detects the power built up in the resonator at the second harmonic. A fraction of the power in the cavity mode 92 is reflected from beamsplitter 106, passes through the filter 108 which transmits about the second harmonic, and illuminates the detector 109. As before, an error signal derived from detector 109 controls the mean excitation of a dithered PZT 104 through a feedback loop. In a variation on the detection scheme, the beamsplitter 106 can be replaced by a dichroic mirror which sends most of the laser frequency beam onto detector 94 and most of the second harmonic beam onto detector 109. The filters 98 and 108 are still needed, but both the power on the detector and the rejection of unwanted frequencies is improved by this means.

The angle and temperature of the second nonlinear element 90 are adjusted to phase match the laser frequency and the second harmonic waves to produce the third frequency as discussed above. This process is the same as described above with the exception of the walkoff behavior. If there is walkoff in the nonlinear interaction, the two beams will be collinear only between the nonlinear element 90 and the output mirror 86. If both nonlinear elements have walkoff, the two walkoff angles will not in general be of the same magnitude or even in the same plane. The walkoff in the element closest to the curved mirror 86 is additionally constrained by the need for good beam overlap in the other nonlinear element. In the case that the walkoff in element 88 occurs close to the same plane as that of element 90, one of the two elements can be rotated 180 degrees about the ordinary beam axis if necessary to produce partial compensation. However, in the general case, walkoff in the element closest to the curved mirror will adversely affect the conversion in the other element. Therefore, the element with the least walkoff should be placed nearest the output mirror 86, which might result in the two elements 88 and 90 being interchanged in FIG. 4. It is desirable that at least one of the elements be phase matched with low walkoff. This might be achieved with a two part walkoff canceling nonlinear element as described above. In the linear cavity, the walkoff in the element closest the planar mirror 84 does not affect the overlap in the other element.

As was the case for the element 88, the longitudinal position of the element 90 should also be adjusted to optimize the relative beam phase. A portion 16 of the generated third harmonic beam is output through the mirror 86, the hole in the PZT 100, and the dichroic mirror 96. As above, the output frequency can also be the fourth harmonic given appropriate phase matching in element 90 and appropriate transmissive coatings on output mirror 86 and dichroic mirror 96.

It is understood that certain variations may be made on the basic linear bidirectional cavity shown in FIG. 4. For example, the cavity may be folded, to create one or more additional focal positions in order to separate the two nonlinear elements into different foci of the cavity, or to include an application specific element. Folding may also be useful to allow input to the resonator at an interior mirror so that no direct reflection optical feedback exists between the input mirror and the source laser system, making possible optical injection locking of a diode source laser.

Figure 5:
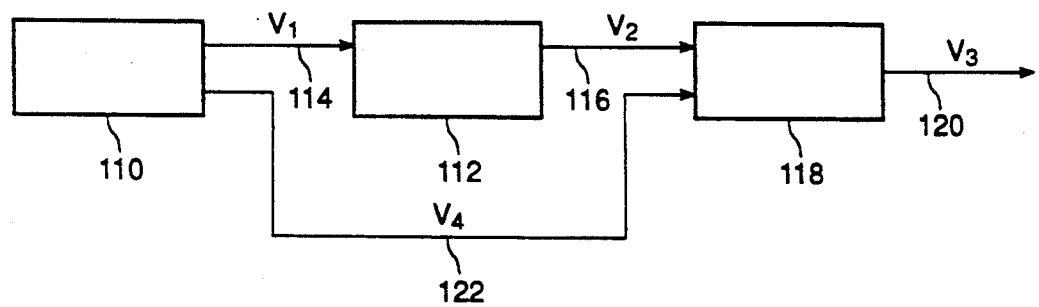
FIG. 5 is a schematic block diagram of a further embodiment of the invention wherein two nonlinear elements are disposed in two successive resonators and two beams are produced by a laser source system.

FIG. 5 is a block diagram of a further alternative embodiment of the invention which separates the two nonlinear elements into two successive resonators. A source laser system 110 produces a first linear polarized monochromatic beam 114 at a first frequency which enters the first resonator system 112. A nonlinear frequency conversion step is performed within the first resonator system 112. An output beam 116, consisting of a linear polarized monochromatic beam at a second frequency emerges from the first resonator system 112 and enters the second resonator system 118. A fourth linearly polarized and monochromatic beam 122 at a fourth frequency is also produced by the source laser system 110 and enters the second resonator system 118. A second nonlinear frequency conversion step is performed within the second resonator system 118, and an output beam 120 emerges at a third frequency. The structure of the apparatus in FIG. 5 is intended to include the case where the path of beam 122 is coaxial with beams 114 and/or 116. In a case of interest, two beams emerge from the source laser system 110 on the same axis and at the same optical frequency, with beam 114 driving the nonlinear conversion in the first resonator system 112, and with beam 122 traversing the first resonator system 112 and entering the second resonator system 118. The source beam 122 and the output beam 116 then drive the nonlinear conversion in second resonator system 118.

Figure 6:
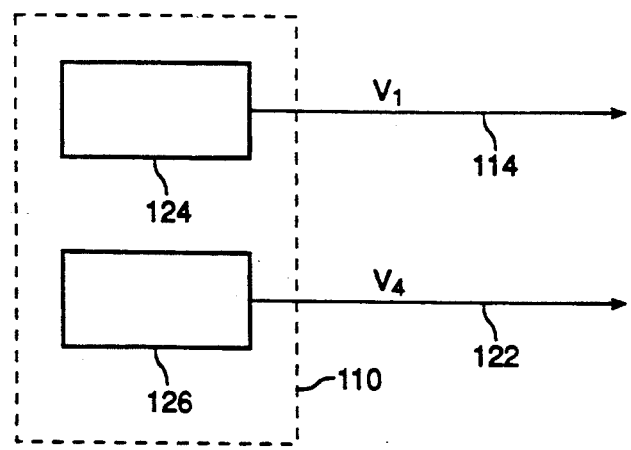
FIG. 6 depicts a specific embodiment of a two beam laser source system.

FIG. 6. shows one specific embodiment of the pump laser system 110 which comprises source laser subsystem 124 producing beam 114 and source laser subsystem 126 producing beam 122. Both laser subsystems 124 and 126 may have the structure of laser system 10 as described in FIG. 2. Variations of this structure includes a source laser system 110 containing a single laser system 10 which emits a single monochromatic linearly polarized beam 14, from which the two beams 114 and 122 are split off by conventional means such as a beamsplitter. In this latter case, the two beams 114 and 122 have the same optical frequency.

Figure 7:
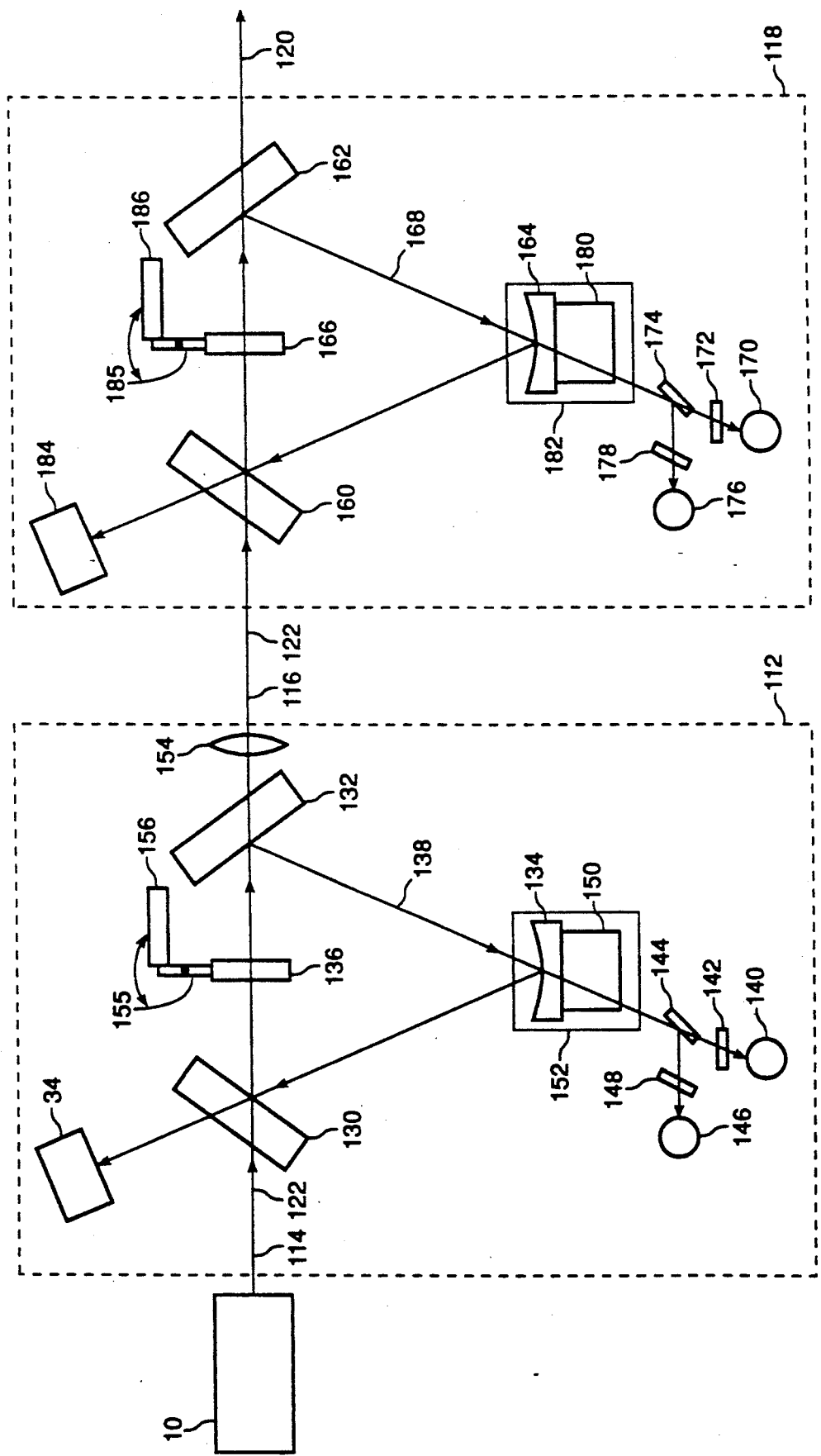
FIG. 7 is a schematic block diagram of a further embodiment of the invention including two ring buildup cavities and two pump beams operative at the same frequency.

FIG. 7. shows a further embodiment of the invention in which the two buildup cavities are ring cavities and the two pump beams are at the same frequency. For variation, the ring resonators are shown as three mirror cavities. A laser system 110 produces linear polarized monochromatic beams 114 and 122 at a first frequency and at a fourth frequency which emerge aligned coaxially. These two beams enter the ring resonator (formed by the flat mirrors 130 and 132, and the curved mirror 134) through the input mirror 130 coaxial with a segment of the resonator mode 138. A nonlinear element 136 is located in the resonator near its focal point between the mirrors 130 and 132. To achieve buildup at the laser frequency, the mirrors 130, 132, and 134 have high reflection at at least the first frequency. Mirror 130 is transmissive at the laser frequency which impedance matches the beam 114 into the resonator.

The output mirror 132 has high transmittance at the second frequency for extraction of the output beam 116 when the first resonator system 112 is singly resonant. When it is doubly resonant, the mirrors 130, 132, and 134 also have high reflectivity at the second frequency, and the output mirror 132 has a second frequency transmissivity which is near the sum of the other resonator losses in the first resonator at that frequency. This output mirror design optimizes the output power. The three mirrors and the nonlinear element are fabricated for minimum absorption, scatter, and diffraction losses at the buildup frequencies. When the source laser system 110 has been properly adjusted, the beam 114 matches the lowest order cavity mode 138 in waist size, location, beam position, and beam angle.

Either the frequency of the pump beam 114 is adjusted to match the frequency of one of the longitudinal modes of the resonator, or vice versa, so that optical power builds up in the resonator mode 138 at the first frequency. The helicity detector 34 generates an error signal as described above which is used in a first feedback loop to stabilize the power built up at the laser frequency, either through actuating the PZT 150 to adjust the cavity length or by adjusting the laser system 110 to control the first frequency. A fraction of the power in the cavity mode 138 leaks through the mirror 134, passes through a hole in the PZT 150, passes through the beamsplitter 144, is spectrally filtered to the laser frequency by the filter 142, and is detected on detector 140 to produce a signal proportional to the power propagating at the first frequency in the cavity mode 138. As an alternative to the helicity detector 34, the laser frequency can be locked to one of the cavity longitudinal mode frequencies using this detector and the Pound-Drever technique.

The angle and temperature of the nonlinear element 136 are adjusted to produce phase matching to generate the second frequency from the first frequency, as described above. In the singly resonant case, the second harmonic beam is extracted through mirror 132 and refocussed by lens 154 to form the beam 116.

In the doubly resonant case, the air path length enclosed by the resonator mirrors is adjusted by moving translator 152 to achieve simultaneous resonance. A second feedback loop rotates the nonlinear element 136 about the polarization vector of the laser frequency in cavity mode 138 with PZT 156 attached to flexure mount 155. Detector 146 detects the power built up in the first resonator at the second harmonic. A fraction of the power in the cavity mode 138 is reflected from beamsplitter 144, passes through the filter 148 which transmits about the second harmonic, and illuminates the detector 146. As before, an error signal derived from detector 146 controls the mean excitation of a dithered PZT 156 through the second feedback loop. Beam 122 is that fraction of the pump laser light which enters the first buildup cavity and is transmitted through the mirror 132. The lens 154 and the distance between the two resonator systems are selected so that the beams 116 at the second harmonic frequency and 122 at the fourth frequency are approximately modematched to the lowest order cavity mode 168 of the second buildup cavity. The mirrors of the second resonator 118 are adjusted so that the cavity mode 168 is aligned to accept the beams 116 and 122 approximately coaxially.

The second ring resonator (formed by the flat mirrors 160 and 162, and the curved mirror 164) contains a second nonlinear element 166 located near its focal point, for generation of a third or output frequency which is a linear combination of the second frequency and the fourth frequency. To achieve a third buildup factor, the mirrors 160, 162, and 164 have high reflection at at least the second frequency. Mirror 160 has a transmission at the second frequency which impedance matches the beam 116 into the second resonator. The output mirror 162 has high transmittance at the third frequency for extraction of the output beam 120. It may be desirable to rotate the second resonator system 118 by 90 degrees about the axis of the beam 116 from what is shown in FIG. 7 so that the second frequency is resonant in cavity mode 168 in "s" polarization which has lower loss than the "p" polarization shown in the figure for simplicity.

When the second buildup cavity is doubly resonant, the mirrors 160, 162, and 164 also have high reflection at the fourth (or the third) frequency to achieve a fourth buildup factor in the tripler (or the quadrupler) configurations, respectively. In the latter case, the output mirror 162 is adjusted to transmit an amount at the third frequency which is nearly equal to the sum of the losses of the second resonator at that frequency.

The three resonator mirrors and the nonlinear element of the second resonator are also fabricated for minimum absorption, scatter, and diffraction losses at the buildup frequencies. The frequency of the pump beam 114 is adjusted so that the second frequency matches the frequency of one of the longitudinal modes of the second resonator, or vice versa. Optical power then builds up in the resonator mode 168 at the second frequency. The helicity detector 184, which is constructed as described for element 34, generates an error signal which is used in a third feedback loop to stabilize the power built up at the second frequency. This is accomplished either through actuating the PZT 180 to adjust the cavity length, or by adjusting the laser system 110 to control the frequency of the beam 114 which indirectly controls the frequency of the second harmonic beam 116. A fraction of the power in the cavity mode 168 leaks through the mirror 164, passes through a hole in the PZT 180, passes through the beamsplitter 174, is spectrally filtered to the second frequency by the filter 172, and is detected on detector 170 to produce a signal proportional to the power propagating at the second frequency in the cavity mode 168. Again, the second frequency may also be locked using this detector and the Pound-Drever technique.

The angle and temperature of the nonlinear element 166 are adjusted as discussed above to phase match the second frequency with either itself or with the fourth frequency to produce the third frequency at a linear combination of the frequencies of the beams 116 and 122. In the doubly resonant case, the air path length enclosed by the second resonator mirrors is adjusted by moving translator 182 to achieve simultaneous resonance at the second harmonic and either the third or the fourth frequency, according to the selected configuration. A fourth feedback loop rotates the nonlinear element 166 about the polarization vector of the laser frequency beam with PZT 186 attached to flexure mount 185 in order to maximize the fourth buildup factor. Detector 176 detects the power built up in the resonator at the selected third or fourth frequency. A fraction of the power in the cavity mode 168 is reflected from beamsplitter 174, passes through the filter 178 which transmits about the selected frequency, and illuminates the detector 176. As before, an error signal derived from detector 176 controls the mean excitation of a dithered PZT 186 through the fourth feedback loop.

Figure 8:
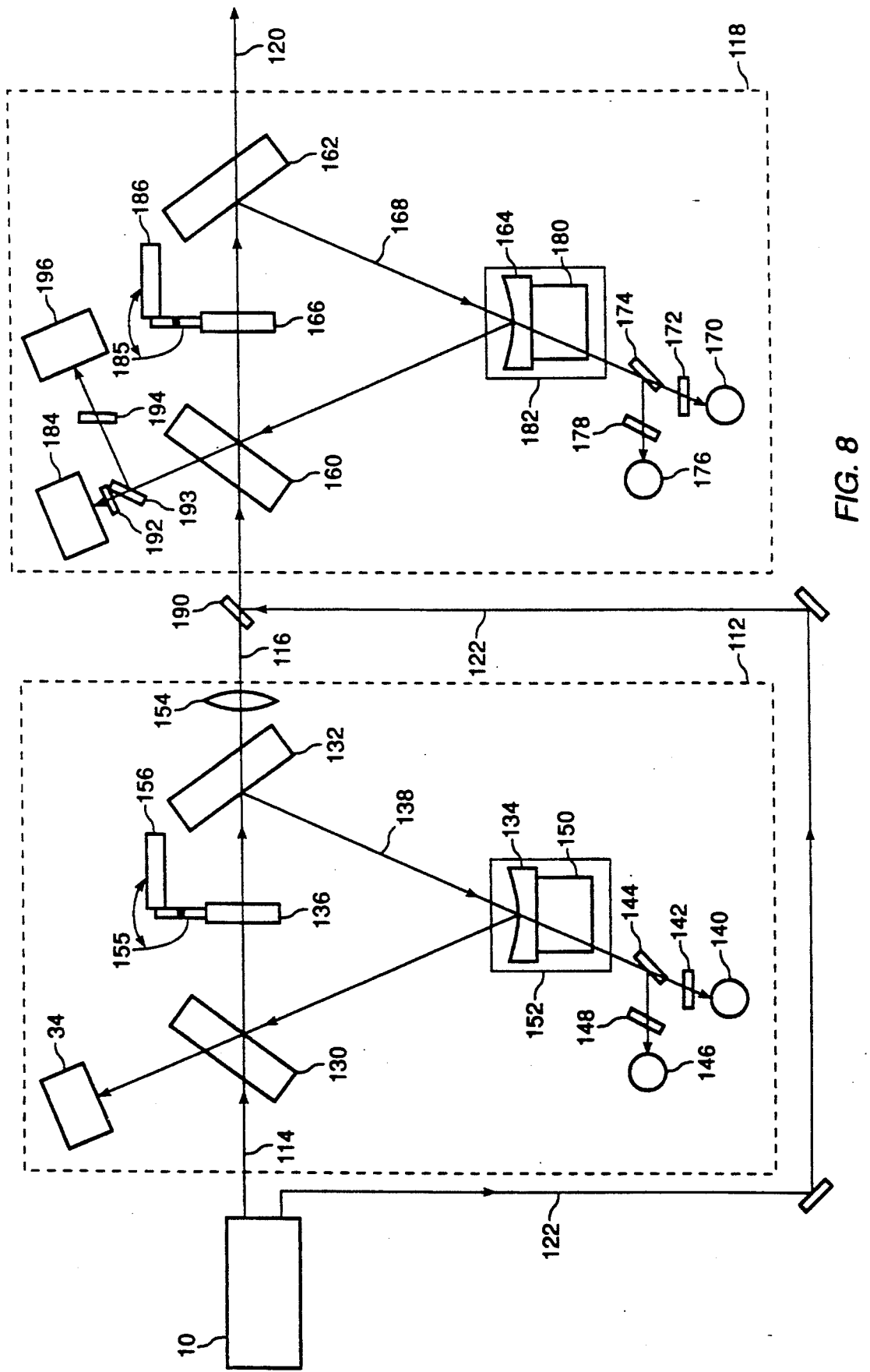
FIG. 8 is a schematic block diagram of a further embodiment of the invention including two ring buildup cavities and two pump beams of different frequencies.

FIG. 8 shows a further embodiment of the invention configured as a tripler in which the two buildup cavities are ring cavities and the two pump beams are at different frequencies. The variations from FIG. 7 are described as all other components are the same. The source laser system 110 is configured as two separate laser subsystems (FIG. 6) which produce beams 112 and 122 traversing different paths between the resonators (FIG. 5). Instead of being injected via the first resonator, beam 122 is reflected from dichroic mirror 190 to enter the second resonator system 118. Dichroic mirror 190 transmits the beam 116 at the second frequency. Source laser system 110 is aligned so that beam 122 enters the resonator 118 coaxial to a segment of and mode matched to the cavity mode 168. In the doubly resonant second cavity case, the mirrors 160, 162, and 164 are now highly reflective at the fourth frequency as described above. A second helicity detector 196 is provided, which has a beamsplitter 193, to control the fourth frequency resonance, and filters 192 and 194 are provided to transmit respectively beams at the second and the fourth frequencies. As an alternative to controlling the optical path length of a beam in the second resonator at the fourth frequency, the frequency of beam 122 can be controlled by the fourth feedback loop to optimize the fourth buildup factor. As a further alternative, the error signal for the fourth feedback loop may be derived at the helicity detector 196.

Figure 9:
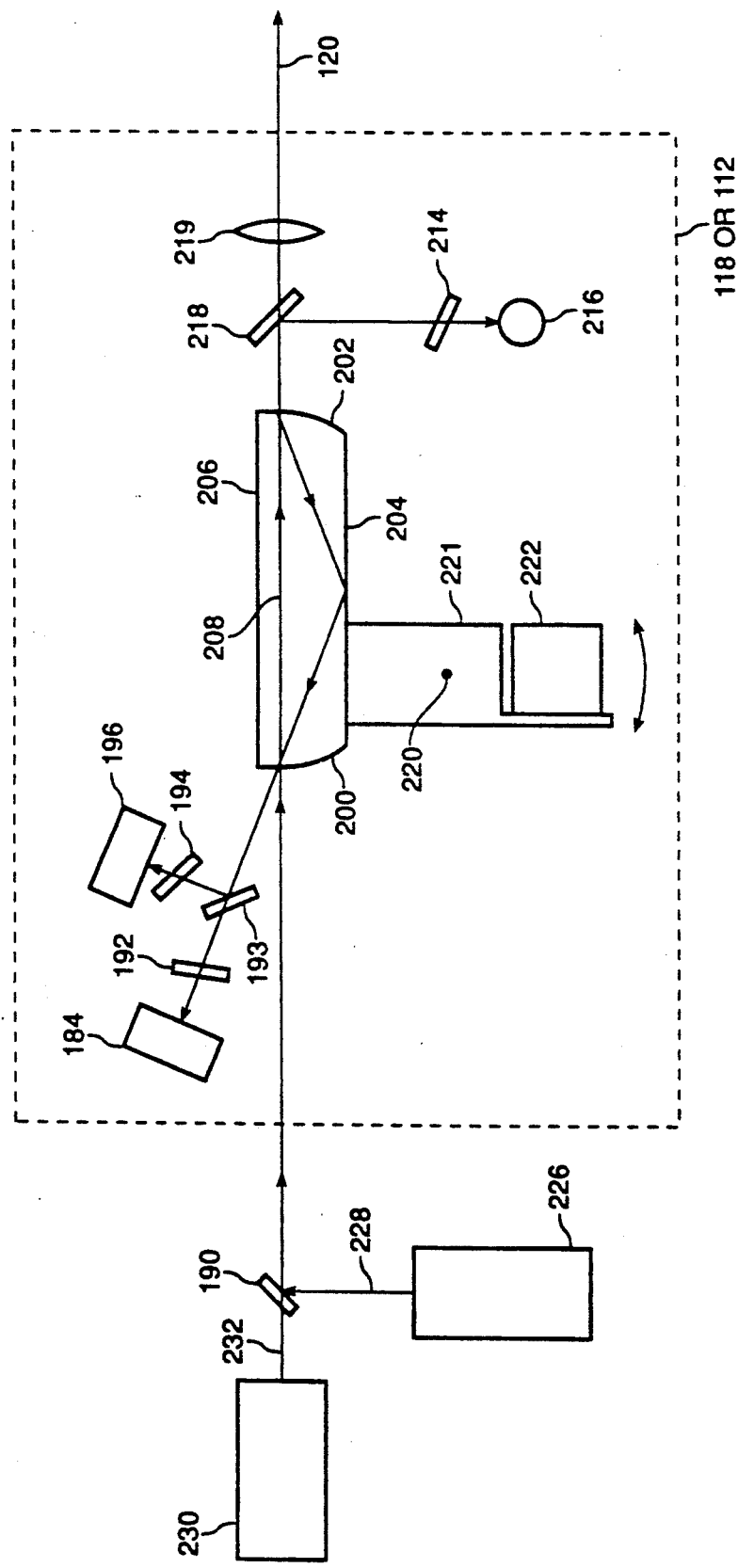
FIG. 9 is a schematic block diagram of a further embodiment of the invention including a monolithic resonant cavity.

FIG. 9 shows a further embodiment of the invention in which one of the buildup cavities 112 or 118 is realized as a monolithic resonator. A monolithic nonlinear element 206 is fabricated to form a resonator. (See Kozlovsky et al. [App. Phys. Lett. Vol. 56, pp. 2291-2292 (1990)].) It is aligned relative to the input beam 232 so that a portion of the input beam traverses the dichroic mirror 190 and enters the monolithic resonator coaxial with the cavity mode 208. An independent source laser system 230 is shown with the structure of laser system 10; it may also be a previous resonator cavity system such as 112. The beam 232 is modematched to the cavity mode 208. Beam 228 emerging from source 226 is similarly aligned and modematched. Source 226 also may have the structure of source laser system 10; but may alternatively be a part of the source laser system 110. The cavity mode 208 preferably makes a reflection at surface 204 at an angle of incidence such that total internal reflection occurs. The element 206 can be configured without total internal reflection, but the surface 204 will then need to be coated for high reflection at the built-up frequencies. In addition, there will be larger astigmatism in the cavity mode 208, and the optical path length in the material is longer, leading to higher optical loss.

The temperature of the monolithic resonator 206 and the second and/or fourth frequencies are adjusted to produce phase matching between the second frequency and the fourth frequency along the straight path between the curved surfaces 200 and 202 where the cavity mode 208 is focussed, to produce radiation at the output frequency which is a linear combination of the two input frequencies. A fraction of the power in the cavity mode 208 emerges as beam 120 through the mirrored surface 206 and is refocussed by lens 219.

Walkoff is also a potential problem in this resonator since in general every path in the entire resonator has a walkoff. The effect of the three walkoff angles is to tilt and shift the mode transversely to the phase matched segment of the mode 208 at the laser frequency. Again, only small amounts of walkoff are tolerable due to the reduced spatial overlap between the two beams. If a 90 degree phase matched nonlinear element is used, then walkoff is not a problem, as in the case where the nonlinear element consists of two elements of nearly the same length, one of which is rotated 180 degrees about the direction of propagation of the ordinary wave along the phase matched axis.

In the mixing configuration, the output surface is coated for high reflection at the frequency of the two input beams 232 and 228, while transmitting maximally at the third frequency. The input surface 200 is coated for transmission coefficients at the frequencies of the beams 232 and 228 which impedance match both beams into the resonator. The nonlinear material and coatings are prepared in order to minimize the absorption, scatter, and diffraction loss at the buildup frequencies. As a result, both the second and the fourth frequencies build up in the cavity mode 208. Two helicity detectors 184 and 196 generate error signals as described above which are used in two feedback loops to stabilize the power built up at the frequencies of beams 232 and 228, respectively, by controlling the frequencies of the laser systems 230 and 226. Filters 192 and 194 pass light only in the vicinity of the frequencies of beams 232 and 228, respectively.

In the doubling configuration, the two input beams are at the same frequency. They may be injected orthogonally polarized for a Type II interaction, or one of them may be omitted. The second resonance is now achieved by fabricating reflecting coatings on surfaces 200, 202, and 204 which have high reflection at both the laser frequency and the output frequency. The output surface 20 is coated for transmission at the output frequency, which should be within a factor of two or so of the sum of the other losses in the resonator at the output frequency. The input surface 200 is coated for a transmission at the frequency of the beam 232 which impedance matches into the resonator. The nonlinear material and coatings are prepared in order to minimize the absorption, scatter, and diffraction loss at the buildup frequencies. As a result, both the input and the output frequencies build up in the cavity mode 208. The helicity detector 184 generates the error signal for the feedback loop which stabilizes the power built up at the input frequency. The helicity detector 196 is not required for the doubling configuration.

To maintain simultaneous resonance with the output frequency, a small rotation may be applied to the element 206 about an axis parallel to the polarization vector at the laser frequency of the cavity mode 208. The resonator may be rotated in the plane of the mode 208, if the monolithic resonator is cut and excited so that the laser polarization vector normal to the plane of the resonator. In Type I phase matching in a uniaxial crystal, this implies that any walkoff occurs in the plane of the cavity mode. The PZT 222 with its associated flexure mount 221 accomplish this adjustment. This adjusts the optical path length of the resonator at the third frequency, placing it on resonance. The axis of rotation 220 of the flexure mount 221 may be located to pass through the mode 208 at its focus between the two mirrors 200 and 202, in order to reduce the misalignment effects of the optical path length adjustment.

A feedback loop should also be set up to maintain the resonance of the third frequency, using an error signal generated from detector 216. A fraction of the beam 120 at the output frequency is split off with beamsplitter 218, filtered to the output frequency with filter 214, and detected with detector 216. As above, dithering the PZT allows the generation of an error signal so that the power propagating in the resonator at the third frequency can be optimized by controlling the mean angle of the element 206.

Figure 10:
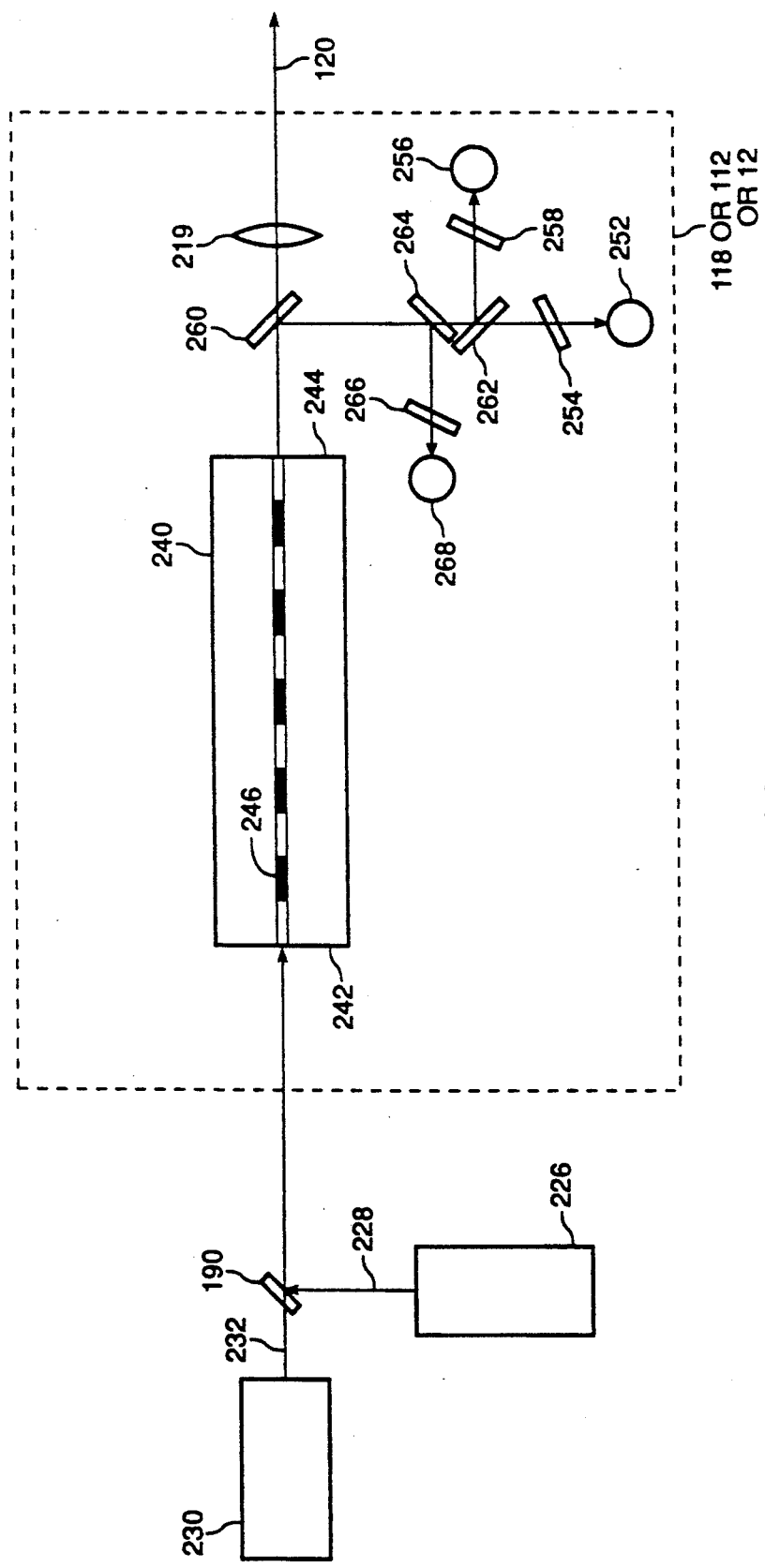
FIG. 10 is a schematic block diagram of a further embodiment of the invention including a waveguide resonator.

FIG. 10 shows a further embodiment of the invention in which one of the buildup cavities 112 or 118 is realized as a waveguide resonator, which is a special case of a monolithic resonator. A nonlinear waveguide element 240 is fabricated with ends 242 and 244 perpendicular to the propagation direction in the waveguide 246. It is aligned relative to the input beam 232 so that a portion of the input beam is transmitted through the mirrored surface 242 and enters the waveguide with a wavefront shape and size matched to that of one of the propagating modes. The waveguide is preferably a single mode waveguide (at least at one of the laser frequencies) to make the matching process less complex. An independent source laser system 230 is shown which may have the structure of source laser system 10, but which may alternatively be a previous resonator cavity system such as 112. Beam 228 which emerges from source 226 is similarly aligned and modematched. Source 226 is a source such as source laser system 10 or a part of source laser system 110.

The waveguide is periodically poled. (See Lim et al [Elect. Lett. Vol. 25 pp. 731-732 (1989)], or Bierlein et al. [Appl. Phys. Lett. Vol. 56 pp. 1725-1727 (1990)].) Periodic poling means the placement of alternating domains of material along the direction of propagation, each domain being a region of the material in which the orientation of the nonlinear tensor of the material is predominantly constant. The orientation of the nonlinear tensor is alternated from domain to domain in such a way as to maintain from period to period an approximately constant relative phase between the interacting beams (or modes). The wavelength of one or both of the beams 232 or 228 is adjusted until the two beams are quasi phase matched for producing radiation at a third frequency which is a linear combination of the first two frequencies, and which emerges as beam 120 through lens 219.

In the doubling configuration, the two input beams are at the same frequency as described above. The output surface 244 is coated for high reflection at the frequency of the input beam 232. In the singly resonant case, the transmission at the output frequency is adjusted to maximum. The input surface 242 is coated for a transmission at the frequency of the input beam which impedance matches into the resonator. The input surface may be coated for antireflection at the output frequency to produce two output beams, or it may be high reflecting. The processing of the nonlinear waveguide and coatings are adjusted in order to minimize the absorption, scatter, and diffraction loss at the buildup frequencies.

The input frequency then builds up in the waveguide 246. A feedback loop may be set up to maintain the input frequency on resonance, using an error signal generated from detector 252 and feeding back to the laser source system 230. The surface 244 allows a small fraction of the input frequency to be transmitted. A fraction of the beam 120 is split off by beamsplitter 260, transmitted through beamsplitters 262 and 264, filtered to the input frequency with filter 254, and detected with detector 252. As above, dithering the source wavelength allows the generation of an error signal from detector 252 so that the power propagating in the resonator at the input frequency can be optimized.

As a variation, the element 240 may be dually resonant. The output face 244 then has a transmission at the output frequency which should be within a factor of two or so of the sum of the other losses in the resonator at the output frequency. The input face 242 is also coated for high reflection at the output frequency. When the input wavelength is tuned through many longitudinal modes of the resonator, the round trip phase advance at the output frequency is slowly adjusted. By tuning over a sufficient number of modes, a wavelength will be found where a mode coincidence exists so that the light can build up simultaneously at the laser frequency and the second harmonic. This is done while monitoring the second harmonic power with detector 256. A fraction of the output beam is reflected from the beamsplitter 262 and filtered to the second harmonic frequency by the filter 258 and detected at detector 256. Once the mode coincidence is found, the input frequency is locked to its coincident mode, producing a dually resonant waveguide cavity. This tuning process will de optimize the phase matching, but the phase matching of the nonlinear element can be temperature tuned to reoptimize the conversion efficiency.

In the mixing configuration, resonance is set up at one or both of the input frequencies. The output surface is coated for high reflection at one or both of the frequencies of the beams 232 and 228, while transmitting maximally at the generated frequency. The input surface 242 is coated for transmission coefficients at the frequencies of the input beams 232 and 228 which impedance match both beams into the resonator. The waveguide and coatings are prepared in order to minimize the absorption, scatter, and diffraction loss at the buildup frequencies. A feedback loop may be set up to maximize the power in the waveguide 246 at the resonated frequencies, as described above. It is done in a similar way for the frequency of the beam 228, using the additional beamsplitter 264, second frequency filter 266 transmissive at the frequency of the beam 228, and detector 268. As above, dithering the source wavelengths allows the generation of error signals so that the powers propagating in the resonator at the input frequencies can be controlled with two feedback loops. This tuning process will also de optimize the phase matching slightly, but less than in the doubling configuration.

Figure 11:
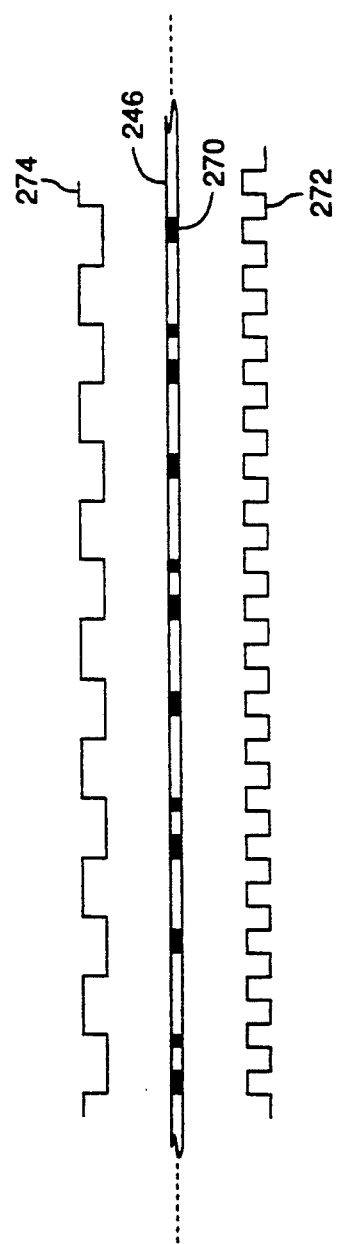
FIG. 11 is a schematic diagram of a segment of a nonlinear waveguide mixer which is periodically poled with two simultaneous periods.

FIG. 11 shows a segment of a nonlinear waveguide mixer in which the nonlinear waveguide is periodically poled with two simultaneous periods. The waveguide 246 is poled as indicated by the shaded regions 270. The poled regions 270 are formed according to the intersection of the desired two poling patterns 272 and 274. These two poling patterns can have incommensurate periods and any desired duty factors. The poling patterns are generated as is well known in the art. By taking the intersection of the two patterns, a new pattern is produced which has a Fourier component at both of the desired poling periods. The net interaction strength is reduced, but that reduction is compensated in the present configuration by resonating one or more of the propagating waves, provided that the waveguide loss is not too low. To the extent that the poling process changes the index of refraction of the waveguide, the poling patterns 272 and 274 must be determined in a self-consistent manner with the arrangement of the poled regions 270.

Many variations of this basic structure are possible, including poling patterns where the second nonlinear conversion process is favored at the expense of the first process by including poled regions in areas of the waveguide where the phase of the conversion process is reversed for the first process but favorable for the second.

This structure is readily fabricated by photolithography and can be formed in $LiNbO_3$, for example, where the waveguide is formed after the poling by proton exchange. (See Lim et al.)

By using the dually quasi phase matched waveguide of FIG. 11 in the configuration of FIG. 10, a waveguide tripler or quadrupler can be fabricated. In the tripler, the input beam 232 is doubled with dual resonance as described for FIG. 10, but using the first quasi phase matched process. The apparatus is the same as described above except that the output face 244 has minimum transmission at the second harmonic frequency to optimize its buildup. The source 226 is omitted unless Type II phase matching is used. The frequency of the input laser beam 232 is then varied across the phase matching acceptance of the device for the first process, in order to optimize the phase matching for the second nonlinear process, which has a narrower acceptance than the first process. The poling pattern for the second process phase matches the second harmonic and the laser frequency to produce a third frequency equal to three times the laser frequency. The output surface 244 is coated for high transmission at the third frequency. The output power is focussed by the lens 219 into the beam 120.

The quadrupler is similar to the tripler except that the poling pattern for the second process phase matches doubling of the second harmonic. The output surface 244 is coated for high transmission at the fourth harmonic.

Figure 12:
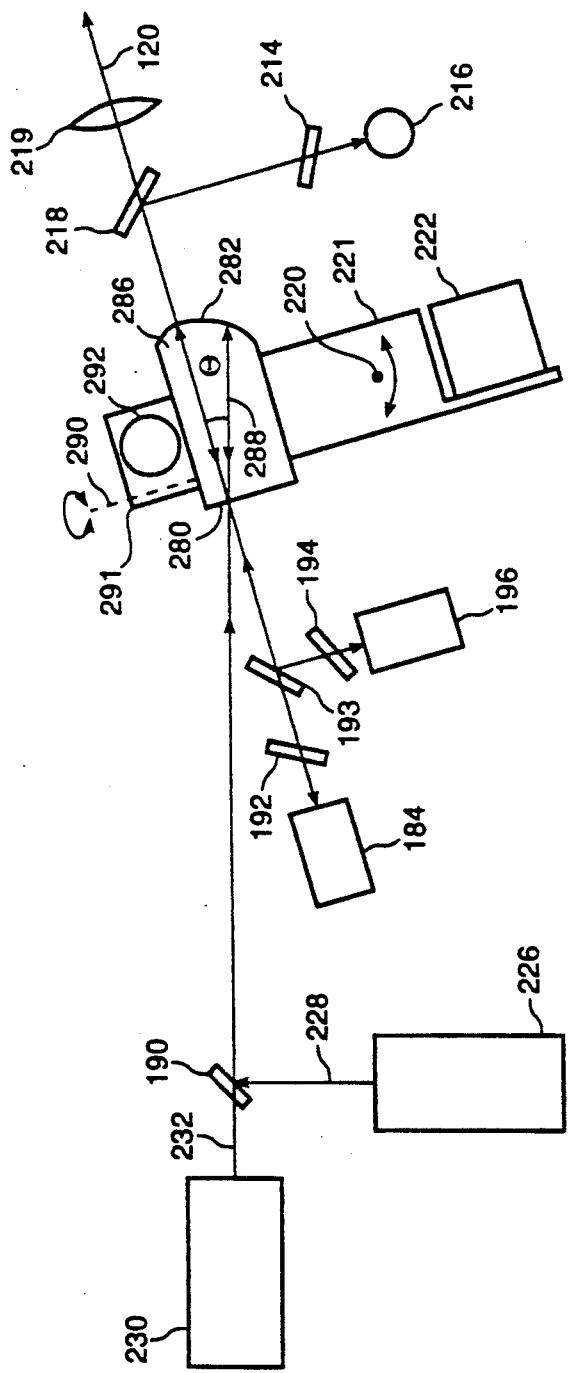
FIG. 12 is a schematic diagram of a further embodiment of the invention including a monolithic resonator having two phase matched interaction regions or optical paths.

FIG. 12 shows an alternative embodiment of the invention in which the buildup cavity is realized as a monolithic resonator, and two paths in the nonlinear material are utilized for nonlinear conversion. A monolithic nonlinear element 286 is fabricated with a curved mirrored surface 282 and a flat mirrored surface 280 forming a resonator with mode 288. It is aligned relative to the input beam 232 so that a portion of the input beam traverses the dichroic mirror 190 and enters the monolithic resonator coaxial with and modematched to the first leg of the cavity mode 288. The second leg of the cavity mode forms an angle theta with the first leg. An independent source laser system 230 is shown with the structure of laser system 10. Beam 228 emerging from source 226 is similarly aligned and modematched. Source 226 also may have the structure of source laser system 10; but it may alternatively be a part of the source laser system 230.

As above, the input mirror is fabricated to impedance match the laser beams 232 and 228 into the resonator, and the curved mirror 282 has high reflectance at the frequencies of the beams 232 and 228. Both mirrors may also have high reflectance at the second frequency which is a linear combination of the frequencies of beams 232 and 228. As an option, high reflectivity may also be provided at the output frequency. The transmissivity of the output mirror 282 at the output frequency is made approximately equal to the sum of the other losses of the resonator at that frequency.

This device functions as a pair of mixers, in which the input beams are both ordinary waves, and the two mixed outputs are both extraordinary waves. The beam 228 may have either the same frequency or a different frequency from the beam 232. If it has the same frequency, the second harmonic is produced in one leg of the device by mixing the laser beam with itself in either a Type I or a Type II process; the third harmonic is produced in the other leg by mixing the second harmonic with the fundamental in a Type II process. If beam 228 has a different frequency from beam 232, the two beams can be mixed in either a Type I or Type II process, or one can be doubled in a Type I process. The second interaction will again be a Type II mixing interaction between one of the two input beams and the output from the first nonlinear interaction.

Both input beams are locked to modes of the resonator by adjusting their frequency in feedback loops slaved to the error signals generated in helicity detectors 184 and 196 as further described above. At least one of the input beams is "s" polarized. The element 286 is translated so that the input beam is reflected back on itself, forming a closed mode path, and the crystal is rotated about an axis parallel to the "s" polarization vector so that one of the legs of the mode 288 is phase matched for the desired doubling or mixing process, producing a beam of a second frequency with "p" polarization. The flexure mount 221 is used for this angular adjust about the axis 220. The PZT 222 may be used for feedback actuation to lock the second frequency to a mode of the cavity, optimizing the power produced at this frequency as further explained above. The element 286 is then rotated about the "p" polarization vector of the mode in the other leg of the mode, until the phase matching condition for the second mixing step is achieved. The flexure mount 291 is used for this angular adjust about the axis 290, and the PZT 292 may be used for feedback actuation if an additional resonance is used at the output frequency.

The invention has now been shown and described with reference to specific embodiments. Other embodiments and changes in the form and details of the invention may be made without departing from the spirit or scope of the invention. It is therefore not intended that the invention be limited, except as indicated by the appended claims.

What is claimed is:

1. An apparatus for generating an optical output beam, the apparatus comprising:

an optical pump means for producing a first optical beam of a first frequency;

a first resonator cavity means for supporting buildup of selected optical power at said first frequency and at a second frequency within said first resonator cavity means, said first resonator cavity means being disposed to have an axis coincident with said first optical beam for admitting a portion of said first optical beam;

a first nonlinear element means in said first resonator cavity means which is phase matched for generating a second optical beam at said second frequency whose frequency is a harmonic multiple of the frequency of said first frequency; and a second nonlinear element means in said first resonator cavity means for combining said first optical beam and said second optical beam and producing a third optical beam at a third frequency which is a linear combination of said first frequency and said second frequency.

2. The apparatus according to claim 1 wherein said first resonator cavity means is a ring resonator.

3. The apparatus according to claim 1 wherein said second nonlinear element means is a portion of said first nonlinear element means.

4. A method for generating oscillations as a frequency shifted optical output beam, the method comprising the steps of:

producing from an optical pump means a first optical beam of a first frequency; thereupon resonating said first optical beam in a first resonator cavity means to build up selected optical power at said first frequency within said first resonator cavity means; thereupon exciting a first nonlinear element means disposed within said first resonator cavity means with said first optical beam at a power level above a critical level to generate useful optical power in a second optical beam of a second frequency which is a harmonic multiple of the said first frequency; thereupon resonating said second optical beam in said first resonator cavity means to build up selected optical power at said second frequency within said first resonator cavity means; thereupon exciting a second nonlinear element means disposed within said first resonator cavity means with at least one of said first optical beam and said second optical beam at a power level above a critical level to generate useful optical power in a third optical beam of a third frequency which is a linear combination of said first frequency and said second frequency.

5. An apparatus for generating an optical output beam, the apparatus comprising:

an optical pump means for producing a first optical beam of a first frequency and a fourth optical beam of a fourth frequency;

a first resonator cavity means for supporting buildup of selected optical power at at least said first frequency within said first resonator cavity means, said first resonator cavity means being disposed to have an axis coincident with said first optical beam for admitting a portion of said first optical beam;

a first nonlinear element means in said first resonator cavity means which is phase matched for generating a second optical beam at a second frequency which is a linear combination of said first frequency and said fourth frequency;

a second resonator cavity means for supporting buildup of selected optical power at at least said second frequency within said second resonator cavity means, said second resonator cavity means being disposed to have an axis coincident with said second optical beam for admitting a portion of said second optical beam; and a second nonlinear element means in said second resonator cavity means for combining said second optical beam and said fourth optical beam and producing a third optical beam at a third frequency which is a linear combination of said second frequency and said fourth frequency.

6. The apparatus according to claim 5 wherein said optical pump means comprises two pump lasers producing respectively said first optical beam and said fourth optical beam.

7. The apparatus according to claim 5 wherein said fourth optical beam is derived from the same source as said first optical beam and said fourth frequency is equal to said first frequency.

8. The apparatus according to claim 5 wherein said first resonator cavity means further comprises:
means for supporting buildup of selected optical power at said second frequency within said first resonator cavity means.

9. The apparatus according to claim 5, further including:
a third feedback means for optimizing the power at said second frequency propagating within said second resonator cavity means.

10. The apparatus according to claim 9 wherein said third feedback means includes means for controlling the optical path length at said second frequency of said second resonator cavity means.

11. The apparatus according to claim 9 wherein said third feedback means includes means for indirectly controlling said second frequency by controlling said first frequency of said first optical beam.

12. The apparatus according to claim 5 wherein said second resonator cavity means further comprises:
optical means for admitting a portion of said fourth optical beam along an axis of said second resonator cavity means.

13. The apparatus according to claim 12 wherein said second resonator cavity means further comprises:
means for supporting buildup of selected optical power at said fourth frequency within said second resonator cavity means.

14. The apparatus according to claim 13, further including:
a fourth feedback means for optimizing the power at said fourth frequency propagating within said second resonator cavity means.

15. The apparatus according to claim 14 wherein said fourth feedback means includes means for controlling the optical path length at said fourth frequency of said second resonator cavity means.

16. The apparatus according to claim 14 wherein said fourth feedback means includes means for controlling said fourth frequency of said fourth optical beam.

17. A method for generating oscillations as a frequency shifted optical output beam, the method comprising the steps of:
producing from an optical pump means a first optical beam of a first frequency and a fourth optical beam of a fourth frequency; thereupon
resonating at least said first optical beam in a first resonator cavity means to build up selected optical power at at least said first frequency within said first resonator cavity means; thereupon
exciting a first nonlinear element means disposed within said first resonator cavity means with said first optical beam at a power level above a critical level to generate useful optical power in a second optical beam of a second frequency which is a harmonic multiple of the said first frequency; thereupon
resonating at least said second optical beam in a second resonator cavity means to build up selected optical power at at least said second frequency within said second resonator cavity means; thereupon
exciting a second nonlinear element means disposed within said first resonator cavity means with at least one of said second optical beam and said fourth optical beam at a power level above a critical level to generate useful optical power in a third optical beam of a third frequency which is a linear combination of said first frequency and said second frequency.

18. The method according to claim 17, further including the step of:
resonating said second optical beam in said first resonator cavity means to build up selected optical power at said second frequency within said first resonator cavity means.

19. The method according to claim 17, further including the step of:
using an electronic signal representative of a portion of said second optical beam to control by feedback the power propagating at said second frequency within said second resonator cavity means.

20. The method according to claim 17, further including the step of:
resonating said fourth optical beam in said second resonator cavity means to build up selected optical power at said fourth frequency within said second resonator cavity means.

21. The method according to claim 20, further including the step of:
using an electronic signal representative of a portion of said fourth optical beam to control by feedback the power propagating at said fourth frequency within said second resonator cavity means.

22. An apparatus for generating a frequency shifted optical output beam, the apparatus comprising:
an optical pump means for producing a first optical beam of a first frequency and a fourth optical beam of a fourth frequency;
a first resonator cavity means for supporting buildup of selected optical power at said first frequency and at said fourth frequency within said first resonator cavity means, said first resonator cavity means being disposed to have an axis coincident with said first optical beam for admitting a portion of said first optical beam and to have an axis coincident with said fourth optical beam for admitting a portion of said fourth optical beam; and
a nonlinear element means in said first resonator cavity means, said nonlinear element means being oriented to phase match said first optical beam and said fourth optical beam along a first optical path for generating a third optical beam at a third frequency which is a linear combination of said first frequency and said fourth frequency.

23. The apparatus according to claim 22 further including:
a second feedback means for optimizing the power at said fourth frequency propagating within said first resonator cavity means.

24. The apparatus according to claim 23 wherein said second feedback means includes means for adjusting the optical path length of fourth optical beam at said fourth frequency within said first resonator cavity means.

25. The apparatus according to claim 23 wherein said second feedback means includes means for controlling said fourth frequency of said fourth optical beam.

26. The apparatus according to claim 22 wherein said fourth optical pump means is a portion of said first optical beam and said fourth frequency is equal to said first frequency.

27. The apparatus according to claim 22 further including:
  means for supporting buildup of selected optical power at said third frequency within said first resonator cavity means.

28. The apparatus according to claim 27 further including:
  a third feedback means for optimizing the power at said third frequency propagating within said first resonator cavity means.

29. The apparatus according to claim 28 wherein said third feedback means includes means for adjusting the optical path length of said third optical beam at said third frequency within said first resonator cavity means.

30. The apparatus according to claim 22 wherein said nonlinear element means is further oriented to phase match any group of said first optical beam, said third optical beam, and said fourth optical beam along a second optical path for generating a second optical beam at a second frequency which is a linear combination of said first frequency, said third frequency, and said fourth frequency.

31. A method for generating oscillations as a frequency shifted optical output beam, the method comprising the steps of:
  producing from an optical pump means a first optical beam of a first frequency and a fourth optical beam of a fourth frequency; thereupon
  resonating said first optical beam and said fourth optical beam in a first resonator cavity means to build up selected optical power at said first frequency and at said fourth frequency within said first resonator cavity means; and thereupon
  exciting a nonlinear element means disposed within said first resonator cavity means with said first and fourth optical beams at power levels above a critical level to generate useful optical power in a third optical beam of a third frequency which is a linear combination of said first frequency and said fourth frequency.

32. The apparatus according to claim 1, 5 or 22, further including:
  a first feedback means for optimizing the power at said first frequency propagating within said first resonator cavity means.

33. The apparatus according to claim 32 wherein said first feedback means includes means for controlling the optical path length at said first frequency of said first resonator cavity means.

34. The apparatus according to claim 32 wherein said first feedback means includes means for controlling said first frequency of said first optical beam.

35. The apparatus according to claim 1 or 5 further including:
  a second feedback means for optimizing the power at said fourth frequency propagating within said first resonator cavity means.

36. The apparatus according to claim 35 wherein said second feedback means includes means for adjusting optical path length of said fourth optical beam at said fourth frequency within said first resonator cavity means.

37. The apparatus according to claim 1 or 5 or 22 wherein said optical pump means comprises at least one diode laser means.

38. The apparatus according to claim 5 or 22 wherein said resonator cavity means includes a ring resonator.

39. The apparatus according to claim 1 or 5 or 22 wherein said resonator cavity means includes a bidirectional resonator.

40. The apparatus according to claim 1 or 5 or 22 wherein said resonator cavity means includes a monolithic resonator.

41. The apparatus according to claim 1 or 5 or 22 wherein said resonator cavity means includes a periodically poled waveguide resonator.

42. The apparatus according to claim 41 wherein said periodically poled waveguide resonator is poled for phase matching two nonlinear conversion processes simultaneously.

43. The method according to claim 4 or 17 or 30, further including the step of:
  controlling power propagating at said first frequency within said first resonator cavity means by an electronic signal representative of said first optical beam.

44. The method according to claim 4 or 18, further including the step of:
  controlling power propagating at said second frequency within said first resonator cavity means by an electronic signal representative of said second optical beam.

* * * * *